(12) United States Patent
Sunohara

(10) Patent No.: US 9,318,351 B2
(45) Date of Patent: Apr. 19, 2016

(54) WIRING SUBSTRATE

(71) Applicant: Shinko Electric Industries Co., Ltd., Nagano-ken (JP)

(72) Inventor: Masahiro Sunohara, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/687,126

(22) Filed: Apr. 15, 2015

(65) Prior Publication Data

US 2015/0311154 A1    Oct. 29, 2015

(30) Foreign Application Priority Data

Apr. 24, 2014  (JP) ................................. 2014-090406

(51) Int. Cl.
| | |
|---|---|
| *H01L 23/52* | (2006.01) |
| *H01L 21/44* | (2006.01) |
| *H01L 21/48* | (2006.01) |
| *H01L 23/498* | (2006.01) |
| *H01L 23/14* | (2006.01) |
| *H01L 23/15* | (2006.01) |

(52) U.S. Cl.
CPC ........ *H01L 21/486* (2013.01); *H01L 23/49827* (2013.01); *H01L 23/49894* (2013.01); *H01L 23/145* (2013.01); *H01L 23/147* (2013.01); *H01L 23/15* (2013.01)

(58) Field of Classification Search
CPC ............... H01L 2224/73265; H01L 23/49827; H01L 24/16; H01L 21/76898
USPC .......... 438/652, 654, 666, 667, 675; 257/618, 257/622, 750, 773–775
See application file for complete search history.

(56) References Cited

U.S. PATENT DOCUMENTS

| | | | |
|---|---|---|---|
| 6,853,046 B2 * | 2/2005 | Shibayama | ....... H01L 27/14643 250/370.14 |
| 8,796,823 B2 * | 8/2014 | Yoda | ................... H01L 21/6835 257/621 |

FOREIGN PATENT DOCUMENTS

JP           2005-11987            1/2005

* cited by examiner

*Primary Examiner* — Hsien Ming Lee
(74) *Attorney, Agent, or Firm* — Fish & Richardson P.C.

(57) ABSTRACT

A wiring substrate includes a substrate body, a through hole extending through the substrate body from an upper surface to a lower surface of the substrate body, and a through electrode formed in the through hole. The through electrode includes a conductive layer that forms a cavity in the through hole, and a resin layer that fills the cavity. The conductive layer includes first to third metal layers. The first metal layer is formed on an upper wall surface of the through hole. The second metal layer covers at least a portion of the first metal layer and an upper opening of the through hole. The third metal layer is formed on a lower wall surface of the through hole and connected to at least the first metal layer or the second metal layer.

7 Claims, 10 Drawing Sheets

WIRING SUBSTRATE

CROSS-REFERENCE TO RELATED APPLICATIONS

This application is based upon and claims the benefit of priority from prior Japanese Patent Application No. 2014-090406, filed on Apr. 24, 2014, the entire contents of which are incorporated herein by reference.

FIELD

This disclosure relates to a wiring substrate and a method for manufacturing a wiring substrate.

BACKGROUND

An interposer is used as a substrate that electrically connects a semiconductor element to a mounting substrate such as a motherboard. For example, a through electrode is formed in the interposer to electrically connect wires arranged in the upper and lower surfaces of a silicon substrate.

A typical method for forming the through electrode will now be described. First, a through hole is formed in a silicon substrate. Then, the silicon substrate is thermally oxidized to form an insulation film on the upper and lower surfaces of the silicon substrate and the wall surface of the through hole. A metal foil is adhered to the lower surface of the silicon substrate and the wall surface of the through hole. Then, electrolytic plating is performed using the metal foil as a power supplying layer so that a plating film (e.g., copper layer) is deposited and grown from the metal foil to fill the through hole with the plating film. Subsequently, the plating film that projects upward from the upper surface of the silicon substrate is polished by performing chemical mechanical polishing (CMP) to form the through electrode. Japanese Laid-Open Patent Publication No. 2005-11987 describes a method for forming such a through electrode. In this manner, the through electrode is formed using a bottom-up plating technique.

In the above method, the entire through hole is filled with the plating film. Thus, the formation of the through electrode takes time.

SUMMARY

One aspect of this disclosure is a wiring substrate including a substrate body, a through hole, and a through electrode. The through hole extends through the substrate body from an upper surface of the substrate body to a lower surface of the substrate body. The through hole includes an upper wall surface, which continues with the upper surface, and a lower wall surface, which continues with the lower surface. The through electrode is formed in the through hole. The through electrode includes a conductive layer that forms a cavity in the through hole, and a resin layer that fills the cavity formed by the conductive layer. The conductive layer includes a first metal layer formed on the upper wall surface of the through hole, a second metal layer that covers at least a portion of the first metal layer and closes an upper opening of the through hole, and a third metal layer formed on the lower wall surface of the through hole and connected to at least one of the first metal layer and the second metal layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

Figure 1:
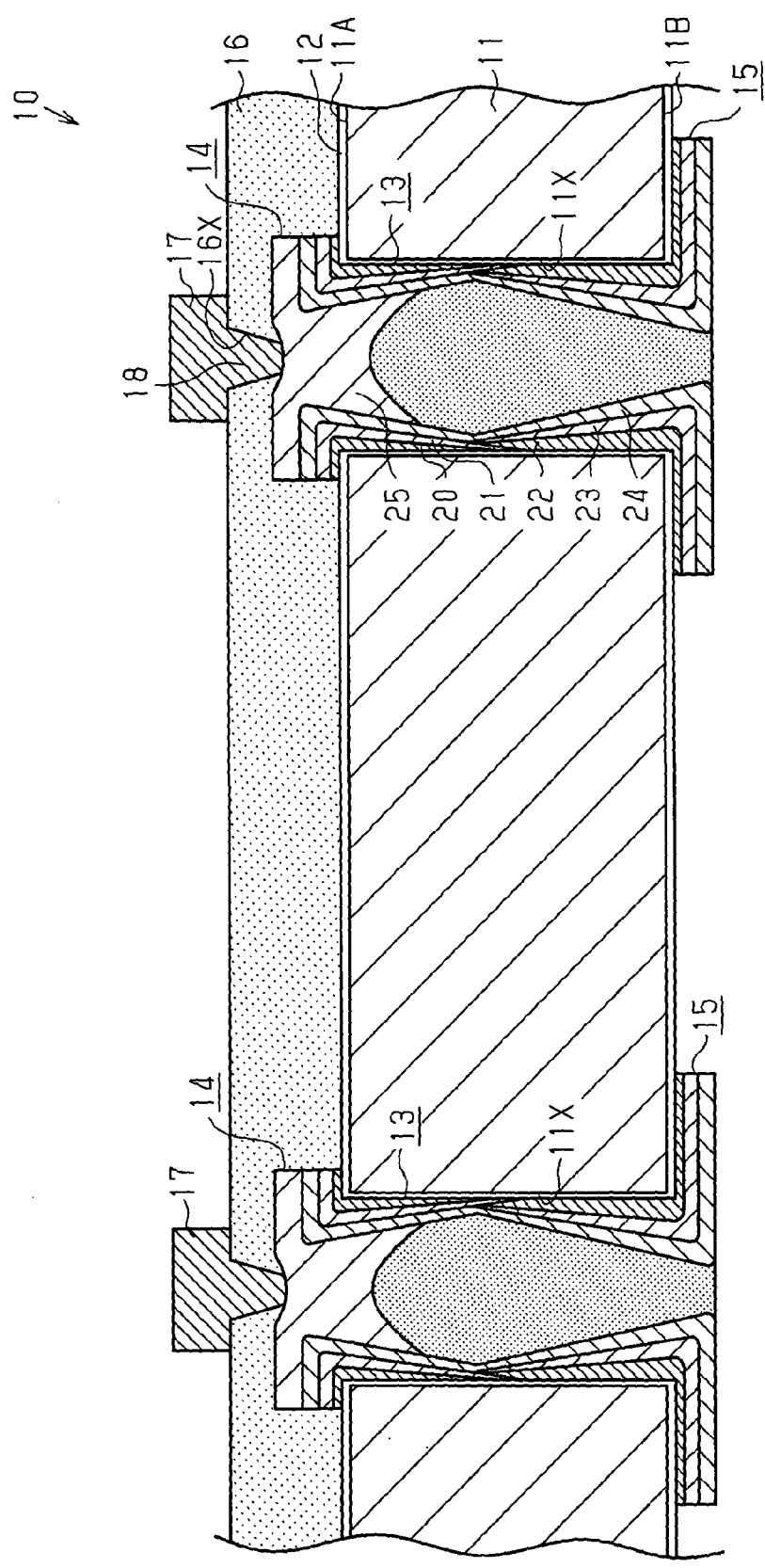
FIG. 1 is a schematic cross-sectional view illustrating a wiring substrate in a first embodiment.

Embodiments will now be described with reference to the drawings. In the drawings, elements are illustrated for simplicity and clarity and have not necessarily been drawn to scale. To facilitate understanding, instead of using hatching lines, components may be shaded.

First Embodiment

A first embodiment will now be described with reference to FIGS. 1 to 6C. A wiring substrate 10 includes a substrate body 11, an insulation film 12, through electrodes 13, a wiring layer 14, a wiring layer 15, an insulation layer 16, and a wiring layer 17. The through electrodes 13 extend through the substrate body 11 from an upper surface 11A to a lower surface 11B of the substrate body 11.

The substrate body 11 may have any shape as viewed from above. For example, the substrate body 11 may have a tetragonal shape. The substrate body 11 may have a thickness of, for example, approximately 100 to 200 μm. The material of the substrate body 11 may be, for example, silicon, glass, or resin.

For example, a semiconductor chip (not illustrated) is mounted on the upper surface of the wiring substrate 10. Semiconductor chips are typically formed by silicon substrates. It is preferred that silicon or borosilicate glass, which has a coefficient of thermal expansion close to that of silicon, be used as the material of the substrate body 11 so that the semiconductor chip and the wiring substrate (substrate body 11) have the same coefficient of thermal expansion. The coefficient of thermal expansion of borosilicate glass, the main components of which are boric acid and silicic acid, is approximately 3 ppm/° C. It is preferred that silicon be used as the material of the substrate body 11 to facilitate processing. In the present embodiment, silicon is used as the material of the substrate body 11.

The substrate body 11 and the semiconductor chip have the same coefficient of thermal expansion to reduce thermal stress at the location where the wiring substrate 10 and the semiconductor chip are coupled when using the wiring substrate 10 under a hot environment or a cold environment.

Through holes 11X extend through the substrate body 11 in the thicknesswise direction at certain locations (two locations in FIG. 1) of the substrate body 11. The through holes 11X extend through the substrate body 11 from the upper surface 11A to the lower surface 11B. Each through hole 11X may have any shape, in a plan view, or any size. For example, each through hole 11X may be circular in a plan view and have a diameter of approximately 20 to 40 µm. When, for example, the through hole 11X has a diameter of 20 µm and the substrate body 11 has a thickness of 200 µm, the through hole 11X has an aspect ratio (ratio of diameter and depth) of 10.

The insulation film 12 continuously covers the upper surface 11A of the substrate body 11, the wall surface of each through hole 11X, and the lower surface 11B of the substrate body 11. The insulation film 12 insulates the through electrodes 13 and the wiring layers 15 from the substrate body 11. The insulation film 12 may have a thickness of, for example, 1 to 2 µm. The insulation film 12 may be, for example, a silicon oxide film or a silicon nitride film.

The through electrodes 13 are formed in the through holes 11X that are covered by the insulation film 12. The through electrodes 13 extend through the substrate body 11 in the thicknesswise direction.

The wiring layer 14 is stacked on the upper surface 11A of the substrate body 11 and the upper surface of each through electrode 13. The wiring layer 14 is electrically connected to the through electrodes 13. For example, the wiring layer 14 includes pads that are circular in a plan view. The pads are formed immediately above the through electrodes 13 and on the upper surface 11A around the through holes 11X. In addition to the pads, the wiring layer 14 may include a patterned portion that is patterned into a predetermined shape in a plan view. The wiring layer 14 may have a thickness of, for example, approximately 2 to 20 µm.

The insulation layer 16 is stacked on the upper surface 11A of the substrate body 11 with the insulation film 12 located in between to cover portions of the wiring layer 14. For example, an insulative resin such as an epoxy resin or a polyimide resin may be used as the material of the insulation layer 16. Alternatively, a resin material formed by mixing a filler, such as silica ($SiO_2$) or alumina ($Al_2O_3$), with an insulative resin may be used as the insulation layer 16. Further, for example, a thermosetting insulative resin or a photosensitive insulation resin may be used as the material of the insulation layer 16. An insulative resin containing a reinforcing material may be used as the material of the insulation layer 16. An insulative resin containing a reinforcing material may be formed by impregnating a reinforcing material, such as a woven fabric or a non-woven fabric of glass, aramid, or liquid crystal polymer (LCP) fibers, with a thermosetting resin, such as an epoxy resin or a polyimide resin. The insulation layer 16 has a thickness of, for example, approximately 2 to 20 µm.

Via holes 16X are formed at predetermined locations in the insulation layer 16. The via holes 16X extend through the insulation layer 16 in the thicknesswise direction and expose portions of the upper surface of the wiring layer 14. Via wirings 18, which electrically connect the wiring layer 14 and the wiring layer 17, are formed in the via holes 16X. In other words, the via holes 16X are filled with the via wirings 18. The via holes 16X and the via wirings 18 are tapered so that the diameter increases from the lower side (through electrodes 13) to the upper side (wiring layer 17) as viewed in FIG. 1. For example, the via holes 16X each have the shape of a reversed truncated cone of which the lower opening has a smaller diameter than the upper opening. In the same manner, the via wirings 18 each have the shape of a reversed truncated cone of which the lower surface has a smaller diameter than the upper surface. The diameter at the upper surface of each via wiring 18 is, for example, approximately 10 to 60 µm.

The via wirings 18 (via holes 16X) are located immediately above the through electrodes 13 (through holes 11X). The via wirings 18 (via holes 16X), which are electrically connected to the through electrodes 13, are stacked over and aligned with the through electrodes 13 in the stacking direction of the wiring substrate 10 (vertical direction as viewed in FIG. 1). In this manner, the via wirings 18 (via holes 16X) of the present example has a stacked-via structure.

The wiring layer 17 is stacked on the upper surface of the insulation layer 16 in connection with the upper surface of each via wiring 18. The wiring layer 17 is formed integrally with the via wirings 18. For example, copper (Cu) or a copper alloy may be used as the material of the wiring layer 17. The wiring layer 17 may have a thickness of, for example, approximately 2 to 20 µm.

The wiring layer 15 is stacked on the lower surface 11B of the substrate body 11 and the lower surface of each through electrode 13. The wiring layer 15 is electrically connected to the through electrodes 13. Further, the wiring layer 15 is electrically connected to the wiring layer 14 via the through electrodes 13. The wiring layer 15 may have a thickness of, for example, 2 to 20 µm.

The wiring layer 15 includes pads that are, for example, circular in a plan view. The pads are formed on the lower surface 11B around the through holes 11X. In addition to the pads, the wiring layer 15 may include a wiring pattern portion that is patterned into a predetermined shape in a plan view on the lower surface 11B of the substrate body 11.

The structure of the through electrode 13 and the wiring layers 14 and 15 will now be described.

Figure 2:
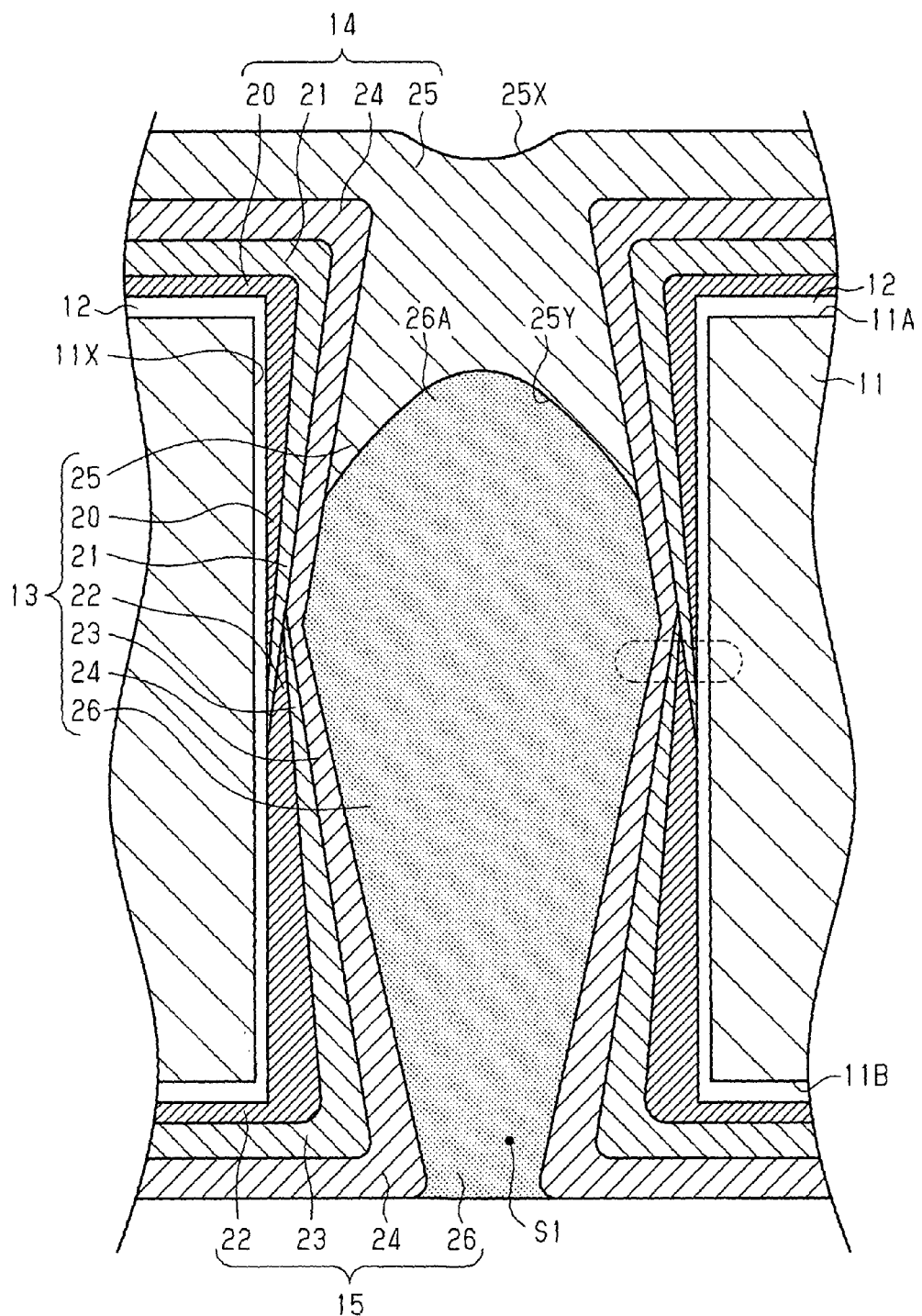
FIG. 2 is an enlarged cross-sectional view of a portion of the wiring substrate illustrated in FIG. 1.

As illustrated in FIG. 2, each through electrode 13 includes an adhesion layer 20, a metal layer 21, an adhesion layer 22, a metal layer 23, a metal layer 24, a metal layer 25, and a resin layer 26.

Each through hole 11X includes an upper wall surface, which continues with the upper surface 11A of the substrate body 11, and a lower wall surface, which continues with the lower surface 11B of the substrate body 11. The upper wall surface corresponds to the upper half of the wall surface of the through hole 11X, and the lower wall surface corresponds to the lower half of the wall surface of the through hole 11X. The adhesion layer 20 partially covers the insulation film 12. For example, the adhesion layer 20 covers the surface of the insulation film 12 over the upper wall surface of the through hole 11X. Further, the adhesion layer 20 covers the surface of the insulation film 12 over the upper surface 11A of the substrate body 11 near the upper opening of the through hole 11X (refer to FIG. 1). In this manner, the adhesion layer 20 extends from the upper wall surface of the through hole 11X to the upper surface 11A of the substrate body 11 and continuously covers the insulation film 12.

The adhesion layer 20 stacked on the insulation film 12 over the upper wall surface of the through hole 11X has a thickness that gradually decreases toward the mid-depth portion of the through hole 11X. Accordingly, the adhesion layer 20 at the mid-depth portion of the through hole 11X is thinner than the adhesion layer 20 at the upper opening of the through hole 11X. Thus, the adhesion layer 20 projects in the horizontal direction toward the center of the through hole 11X near the upper opening of the through hole 11X. The thickness of the adhesion layer 20 may be, for example, approximately, 0.2 to 5 µm over the upper surface 11A of the substrate body 11 and near the upper opening of the through hole 11X.

Preferably, the material of the adhesion layer 20 has higher adhesion to the insulation film 12 (e.g., silicon oxide film)

than the metal layer 21 (e.g., copper layer). For example, titanium (Ti), tantalum (Ta), chromium (Cr), or titanium tungsten (TiW) may be used as the material of the adhesion layer 20. Further, for example, a metal film (sputter film) formed through sputtering may be used as the adhesion layer 20. The adhesion layer 20 that is formed through sputtering has a higher metallic density than a metal layer formed through, for example, electroless plating or electrolytic plating.

The metal layer 21 covers the surface of the adhesion layer 20. In other words, the adhesion layer 20 is formed between the substrate body 11 (insulation film 12) and the metal layer 21. The metal layer 21 includes an end located near the mid-depth portion of the through hole 11X. The end of the metal layer 21 is directly formed on the insulation film 12 without the adhesion layer 20 located in between. That is, the metal layer 21 covers a portion of the surface of the insulation film 12 that extends out of the adhesion layer 20 near the mid-depth portion of the through hole 11X.

The metal layer 21 stacked on the adhesion layer 20 over the upper wall surface of the through hole 11X has a thickness that gradually decreases toward the mid-depth portion of the through hole 11X. The thickness of the metal layer 21 may be, for example, approximately, 0.2 to 5 µm on the upper surface 11A of the substrate body 11 and near the upper opening of the through hole 11X.

For example, copper or a copper alloy may be used as the material of the metal layer 21. A sputter film formed through sputtering may be used as the metal layer 21.

The adhesion layer 22 partially covers the insulation film 12. For example, the adhesion layer 22 covers the surface of the insulation film 12 over the lower wall surface of the through hole 11X. In the present example, the adhesion layer 22 entirely covers the surface of the insulation film 12 that extends out of the metal layer 21 over the lower wall surface of the through hole 11X. Further, the adhesion layer 22 covers the end of the metal layer 21 near the mid-depth portion of the through hole 11X. The adhesion layer 22 includes an end located near the mid-depth portion of the through hole 11X. The end of the adhesion layer 22 covers the insulation film 12, the adhesion layer 20, and the metal layer 21. Further, the adhesion layer 22 covers the surface of the insulation film 12 over the lower surface 11B of the substrate body 11 near the lower opening of the through hole 11X (refer to FIG. 1). In this manner, the adhesion layer 22 extends from the lower wall surface of the through hole 11X to the lower surface 11B of the substrate body 11 to continuously cover the insulation film 12 and partially cover the metal layer 21 and the adhesion layer 20.

The adhesion layer 22 stacked on the insulation film 12 over the lower wall surface of the through hole 11X has a thickness that gradually decreases toward the mid-depth portion of the through hole 11X. Accordingly, the adhesion layer 22 at the mid-depth portion of the through hole 11X is thinner than the adhesion layer 22 at the lower opening of the through hole 11X. Thus, the adhesion layer 22 projects in the horizontal direction toward the center of the through hole 11X near the lower opening of the through hole 11X. The thickness of the adhesion layer 22 may be, for example, approximately, 0.05 to 5 µm over the lower surface 11B of the substrate body 11 and near the lower opening of the through hole 11X.

Preferably, the material of the adhesion layer 22 has higher adhesion to the insulation film 12 (e.g., silicon oxide film) than the metal layer 23 (e.g., copper layer). For example, titanium, tantalum, chromium, or titanium tungsten may be used as the material of the adhesion layer 22. Further, for example, a sputter film formed through sputtering may be used as the adhesion layer 22.

The metal layer 23 covers the surface of the adhesion layer 22. In other words, the adhesion layer 22 is formed between the substrate body 11 (insulation film 12) and the metal layer 23. The metal layer 23 includes an end located near the mid-depth portion of the through hole 11X. The end of the metal layer 23 is directly formed on the metal layer 23 without the adhesion layer 22 located in between. That is, the metal layer 23 covers a portion of the surface of the metal layer 21 that extends out of the adhesion layer 22 near the mid-depth portion of the through hole 11X.

In this manner, the adhesion layer 20, the metal layer 21, the adhesion layer 22, and the metal layer 23 are stacked in this order on the insulation film 12 in the through hole 11X near the mid-depth portion (refer to broken lines in FIG. 2).

The metal layer 23 stacked on the adhesion layer 22 at the lower wall surface of the through hole 11X has a thickness that gradually decreases toward the mid-depth portion of the through hole 11X. The thickness of the metal layer 23 may be, for example, approximately, 0.05 to 5 µm over the lower surface 11B of the substrate body 11 and near the lower opening of the through hole 11X.

For example, copper or a copper alloy may be used as the material of the metal layer 23. A sputter film formed through sputtering may be used as the metal layer 23.

The metal layer 24 covers the surface of the metal layer 21 and the surface of the metal layer 23. In the present example, the metal layer 24 continuously covers the entire surface of the metal layer 21, which is stacked over the upper surface 11A of the substrate body 11 and the upper wall surface of the through hole 11X, and the entire surface of the metal layer 23, which is stacked over the lower wall surface of the through hole 11X and the lower surface 11B of the substrate body 11.

The metal layer 24 stacked on the metal layers 21 and 23 has a thickness that gradually decreases from the upper wall portion toward the mid-depth portion of the through hole 11X and from the lower wall portion toward the mid-depth portion of the through hole 11X. The metal layer 24 at the mid-depth portion of the through hole 11X is thinner than the metal layer 24 at the upper opening of the through hole 11X and the metal layer 24 at the lower opening of the through hole 11X.

For example, copper or a copper alloy may be used as the material of the metal layer 24. For example, a metal layer formed through electrolytic plating (electrolytic plating metal layer) may be used as the metal layer 24.

The upper open region of the through hole 11X is filled with the metal layer 25. In the present example, the metal layer 25 closes the upper opening of the through hole 11X that is surrounded by the multilayer of the adhesion layer 20 and the metal layers 21 and 24. In other words, the upper opening of the through hole 11X is closed by the adhesion layer 20 and the metal layers 21, 24, and 25. Further, the metal layer 25 is stacked over the upper surface 11A of the substrate body 11 near the upper opening of the through hole 11X with the insulation film 12, the adhesion layer 20, and the metal layers 21 and 24 located between the metal layer 25 and the upper surface 11A. In this manner, the metal layer 25 closes the upper opening of the through hole 11X and extends out the through hole 11X over the upper surface 11A. The upper surface of the metal layer 25 includes a recess 25X that hollows in the downward direction. The recess 25X is located at a position overlapping the through hole 11X in a plan view. The lower surface of the metal layer 25 in the through hole 11X includes a recess 25Y that hollows in the upward direction. The recess 25Y is, for example, curved in the upward direction.

The adhesion layers 20 and 22 and the metal layers 21, 23, 24, and 25 serve as a conductive layer. The conductive layer defines a cavity S1 in the through hole 11X. The cavity S1 in the through hole 11X is filled with the resin layer 26. In the present example, the cavity S1, which is surrounded by the metal layer 25 and the metal layer 24, is filled with the resin layer 26. Accordingly, the recess 25Y is filled with the resin layer 26. This forms a projection 26A that projects in the upward direction in conformance with the shape of the recess 25Y.

For example, an insulative resin such as an epoxy resin or a polyimide resin may be used as the material of the resin layer 26. Alternatively, a resin material formed by mixing a filler, such as silica or alumina, with an insulative resin may be used as the resin layer 26. In this case, preferably, the coefficient of thermal expansion of the resin layer 26 is set at a median value between the coefficient of thermal expansion of the substrate body 11 (e.g., silicon substrate) and the coefficient of thermal expansion of the metal layer 24 (e.g., copper layer) by, for example, adjusting the content of the filler in the resin material. More preferably, the content of the filler in the resin material is adjusted so that the coefficient of thermal expansion of the resin layer 26 becomes closer to that of the metal layer 24 than the substrate body 11. The coefficient of thermal expansion of the resin layer 26 is set to, for example, 2 to 50 ppm/° C. (preferably, 4 to 16 ppm/° C. and more preferably, 12 to 16 ppm/° C.).

The adhesion layers 20 and 22, the metal layers 21, 23, 24, and 25, and the resin layer 26 function as the through electrode 13 in the through hole 11X. The adhesion layer 20 and the metal layers 21, 24, and 25 function as the wiring layer 14 on the upper surface 11A of the substrate body 11. The upper end of the through electrode 13 also functions as a portion of the wiring layer 14. In this manner, the wiring layer 14 is formed integrally with the upper end of the through electrode 13. The adhesion layer 22, the metal layers 23 and 24, and the resin layer 26 function as the wiring layer 15 on the lower surface 11B of the substrate body 11. The lower end of the through electrode 13 also functions as a portion of the wiring layer 15. In this manner, the wiring layer 15 is formed integrally with the lower end of the through electrode 13. The lower surface of the resin layer 26 is exposed from the lower surface of the wiring layer 15. The pad formed on the wiring layer 15 may partially include the lower surface of the resin layer 26.

A method for manufacturing the wiring substrate 10 will now be described with reference to FIGS. 3A to 6C. FIGS. 3A to 6C are enlarged views illustrating a through hole 11X and the surrounding of the through hole 11X.

Figure 3A:
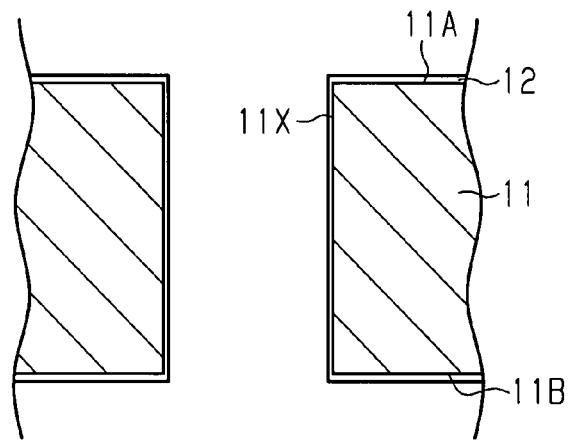
FIGS. 3A to 3C, 4A to 4C, 5A to 5C, and 6A to 6C are schematic cross-sectional views illustrating how the wiring substrate of FIG. 1 is manufactured.

In the step illustrated in FIG. 3A, the substrate body 11 is prepared. For example, a six-inch (approximately 150 mm), eight-inch (approximately 200 mm), or twelve-inch (approximately 300 mm) silicon wafer may be used as the substrate body 11. The silicon wafer has a thickness of, for example, 0.625 mm (for a six-inch wafer), 0.725 mm (for an eight-inch wafer), or 0.775 mm (for a twelve-inch wafer). Further, the thickness of the silicon wafer may be reduced with a backside grinder or the like. The thinned silicon wafer (substrate body 11) may have a thickness of, for example, 100 to 200 μm.

Then, the through holes 11X, which extend from the upper surface 11A to the lower surface 11B of the substrate body 11, are formed at predetermined locations in the substrate body 11. For example, a resist layer (not illustrated) including an opening pattern is formed on the substrate body 11. The substrate body 11 is etched using the resist layer as a mask to form the through holes 11X. For example, the etching may be anisotropic etching such as deep reactive ion etching (DRIE) using sulfur hexafluoride ($SF_6$).

The insulation film 12 is formed next. The insulation film 12 entirely covers the surfaces of the substrate body 11 including the wall surface of each through hole 11X. For example, when the substrate body 11 is a silicon substrate and the insulation film 12 is a silicon oxide film, wet thermal oxidation may be performed. Wet thermal oxidation forms the insulation film 12 by thermally oxidizing the surface of the substrate body 11 substrate body 11 at a temperature of, for example, 1000° C. or higher. Alternatively, the insulation film 12 may be formed by performing chemical vapor deposition (CVD).

Figure 3B:
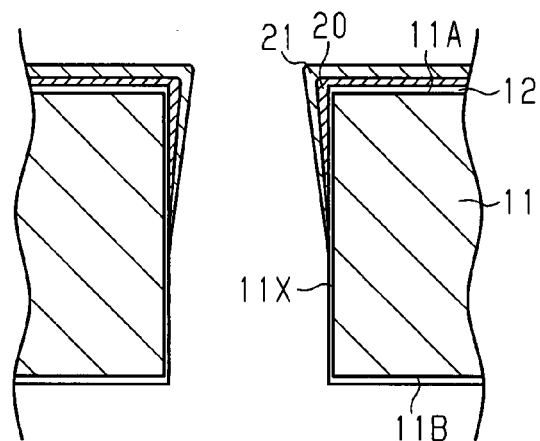

In the step illustrated in FIG. 3B, the adhesion layer 20 and the metal layer 21 are sequentially formed at locations corresponding to the upper surface of the substrate body 11 and the upper wall surface of the through hole 11X. For example, sputtering may be performed to form the adhesion layer 20 and the metal layer 21. For example, titanium (Ti) may be sputtered toward the upper surface 11A of the substrate body 11 to deposit the adhesion layer 20 at locations corresponding to the upper surface 11A of the substrate body 11 and the upper wall surface of the through hole 11X. Then, copper is sputtered to deposit the metal layer 21 on the adhesion layer 20. In this case, the deposited amount of titanium or copper increases at the upper surface 11A and near the upper opening of the through hole 11X, and gradually decreases toward the mid-depth portion of the through hole 11X. Accordingly, the thickness of the adhesion layer 20 and the thickness of the metal layer 21 gradually decrease toward the mid-depth portion of the through hole 11X.

When the insulation film 12 is a silicon oxide film and the material of the metal layer 21 is copper, the adhesion of the insulation film 12 and the metal layer 21 would be low. In the present example, the adhesion layer 20 (e.g., Ti layer), which has a higher adhesion to the insulation film 12 than the metal layer 21, is arranged between the insulation film 12 and the metal layer 21. Accordingly, the adhesion layer 20 adheres the insulation film 12 to the metal layer 21 in a favorable manner.

Figure 3C:
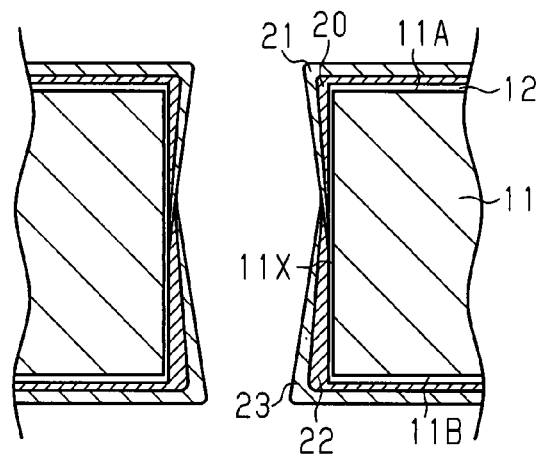

In the step illustrated in FIG. 3C, the adhesion layer 22 and the metal layer 23 are sequentially formed at locations corresponding to the lower surface 11B of the substrate body 11 and the lower wall surface of the through hole 11X. For example, sputtering may be performed to form the adhesion layer 22 and the metal layer 23. For example, titanium may be sputtered toward the lower surface 11B of the substrate body 11 to deposit the adhesion layer 22 at locations corresponding to the lower surface 11B of the substrate body 11 and the lower wall surface of the through hole 11X. Then, copper is sputtered to deposit the metal layer 23 on the adhesion layer 22. In this case, the deposited amount of titanium or copper increases at the lower surface 11B and near the lower opening of the through hole 11X, and gradually decreases toward the mid-depth portion of the through hole 11X. Further, in this step, the sputtering of titanium is continued until the adhesion layer 22 covers the end of the metal layer 21 at the mid-depth portion of the through hole 11X. This increases the electrical connection reliability of the adhesion layer 22 and the metal layer 21 (adhesion layer 20). When the adhesion layer 22 and the metal layer 23 are formed, the adhesion layer 20, the metal layer 21, the adhesion layer 22, and the metal layer 23 are sequentially stacked on the insulation film 12 near the mid-depth portion of the through hole 11X.

The adhesion layer 22 (e.g., Ti layer), which has a higher adhesion to the insulation film 12 than the metal layer 23, is arranged between the insulation film 12 and the metal layer 23. Accordingly, the adhesion layer 22 adheres the insulation film 12 to the metal layer 23 in a favorable manner.

The above manufacturing steps form a seed layer, which includes the adhesion layers 20 and 22 and the metal layers 21 and 23, on the insulation film 12.

Figure 4A:
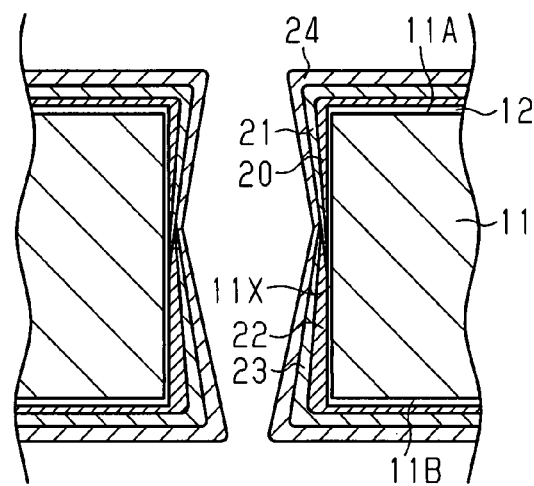

In the step illustrated in FIG. 4A, the metal layer 24 is formed entirely covering the surfaces of the metal layers 21 and 23. The metal layer 24 is formed through, for example, electrolytic plating that uses the seed layer (adhesion layers 20 and 22 and the metal layers 21 and 23) as a power supplying layer. For example, the structure illustrated in FIG. 3C is immersed in an electrolytic copper solution contained in a plating tank, and electrolytic plating is applied to the surface of the metal layers 21 and 23 to form the metal layer 24. When electrolytic plating is performed, current concentrates at the corner of the metal layer 21 in the upper opening of the through hole 11X and the corner of the metal layer 23 in the lower opening of through hole 11X. Thus, the metal layer 24 formed at the corners of the metal layers 21 and 23 is thicker than the metal layer 24 formed at the mid-depth portion of the through hole 11X. The thickness of the metal layer 24 gradually decreases toward the mid-depth portion of the through hole 11X.

Figure 4B:
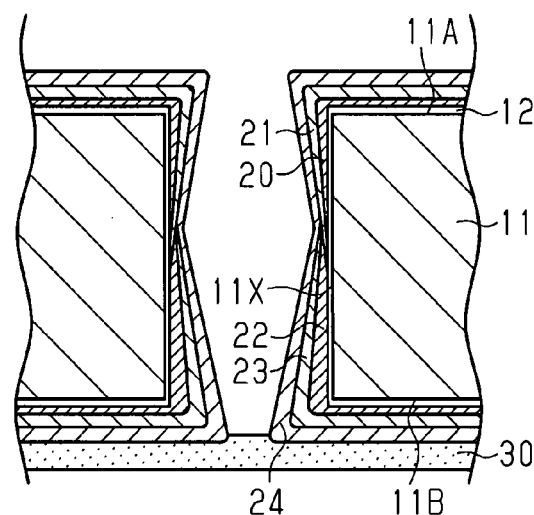

In the step illustrated in FIG. 4B, a protective film 30 laminates the lower surface 11B of the substrate body 11. The protective film 30 closes the lower opening of the through hole 11X. Further, the protective film 30 covers the lower surface of the metal layer 24 and forms a closed end of the through hole 11X. For example, a resin film is used as the protective film 30. A portion of the protective film 30 may project into the through hole 11X.

Figure 4C:
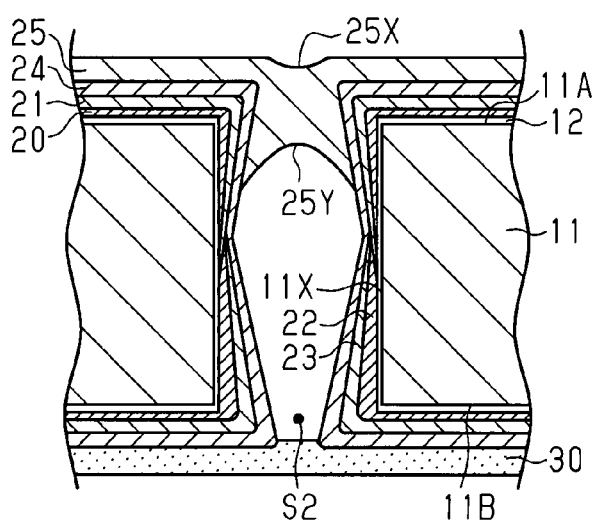

In the step illustrated in FIG. 4C, the metal layer 25 is formed. The metal layer 25 closes the upper opening of the through hole 11X and covers the upper surface of the metal layer 24, which is stacked on the upper surface 11A of the substrate body 11 with the adhesion layer 20 and the metal layer 21 located in between. For example, the structure illustrated in FIG. 4B is immersed in an electrolytic plating solution, which is contained in a plating tank. The adhesion layer 20 and the metal layer 21 are both used as a power supplying layer to apply electrolytic plating to the surface of the metal layer 24 and form the metal layer 25. For example, a via fill electrolytic plating solution may be used as the electrolytic plating solution. The via fill electrolytic plating solution may include copper sulfate, sulfuric acid, and chloride ion as a basic composition. Further, the via fill electrolytic plating solution may include additives, such as polymeric compounds functioning as a surface-active agent, sulfur compounds functioning as a brightener, and nitride-containing compounds as a leveler. In this step, the plating film grows in an isotropic manner from the upper surface of the metal layer 24 and the corner of the metal layer 24, which projects into the through hole 11X near the upper opening. Accordingly, a lid plating (metal layer 25), which closes the upper opening of the through hole 11X, is formed near the corner of the metal layer 24. Here, the plating film (metal layer 25) grows in an isotropic manner from the corner of the metal layer 24. Thus, the recess 25X is formed in the upper surface of the metal layer 25 at a location overlapping the through hole 11X in a plan view, and the recess 25Y is formed in the lower surface of the metal layer 25 inside the through hole 11X. When the metal layer 25 closes the upper opening of the through hole 11X, a cavity S2 is formed surrounded by the metal layer 25, the metal layer 24, and the protective film 30. In this step, the protective film 30 closes the lower opening of the through hole 11X, and the electrolytic plating solution does not enter the cavity S2. Thus, the plating film does not enter the cavity S2 even if electrolytic plating continues.

The above manufacturing steps close the upper opening of the through hole 11X with the adhesion layer 20 and the metal layers 21, 24, and 25.

Figure 5A:
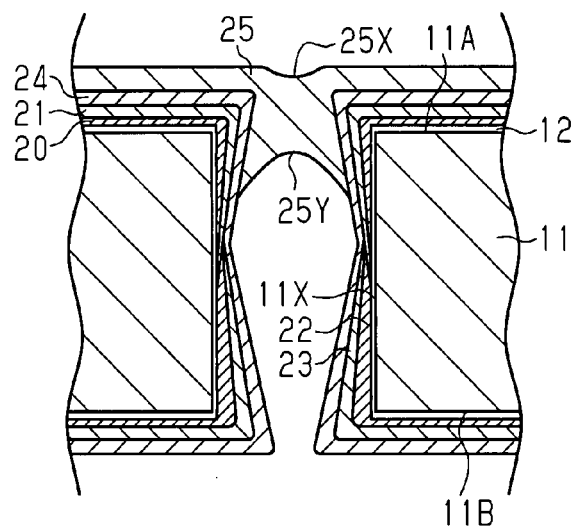

In the step illustrated in FIG. 5A, the protective film 30 is removed. For example, an organic solvent may be used to melt and remove the protective film 30. Alternatively, the protective film 30 may be mechanically removed. Removal of the protective film 30 exposes the lower opening of the through hole 11X. Here, the metal layer 25 forms a closed end of the through hole 11X, and the through hole 11X is recessed.

Figure 5B:
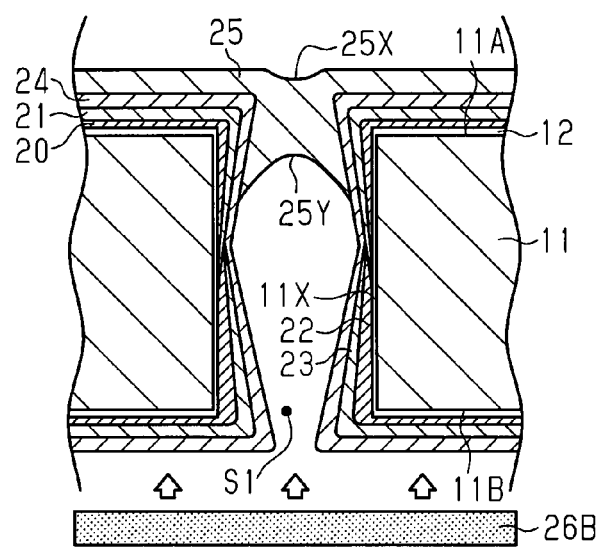
Figure 5C:
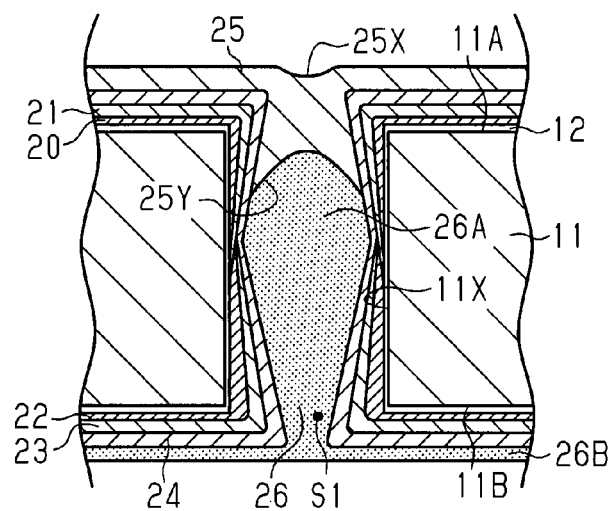

In the steps illustrated in FIGS. 5B and 5C, the resin layer 26 is formed. The through hole 11X, the wall of which is covered by the metal layers 24 and 25, namely, the cavity S1 surrounded by the metal layer 24 and the metal layer 25 is filled with the resin layer 26.

In the step illustrated in FIG. 5B, a sheet of a resin layer 26B is prepared. The resin layer 26B is used in, for example, the B-stage (semi-cured condition). The resin layer 26B may have a thickness of, for example, 10 to 50 μm. The resin layer 26B is arranged opposing the lower surface 11B of the substrate body 11.

In the step illustrated in FIG. 5C, for example, the resin layer 26B is heated in a vacuum atmosphere to a temperature of approximately 80° C. to 150° C. and pressurized from below. This fills the cavity S1 with the resin layer 26B in the semi-cured condition. In the example illustrated in FIG. 5C, the resin layer 26B covers the lower surface of the metal layer 24. Then, a thermal curing process is performed to cure the resin layer 26B at a temperature of, for example, 180° C. to 250° C. This cures the resin layer 26B in the cavity S1. As a result, the projection 26A of the resin layer 26 is formed in conformance with the recess 25Y'. The resin layer 26 may be formed through, for example, screen printing or spin coating.

Figure 6A:
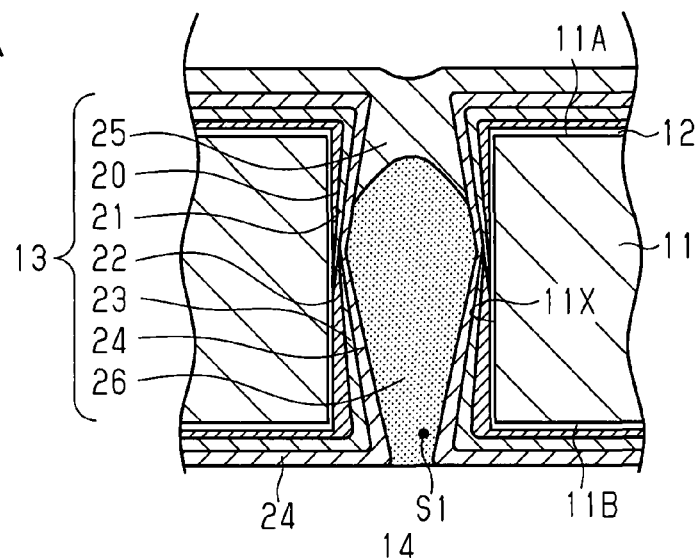

In the step illustrated in FIG. 6A, mechanical grinding, mechanical polishing, chemical mechanical polishing (CMP), or the like is performed to polish the resin layer 26B projecting downward from the lower surface of the metal layer 24. This exposes the lower surface of the metal layer 24, and the lower surface of the resin layer 26 becomes generally flush with the lower surface of the metal layer 24. The above manufacturing steps forms the through electrode 13 in the through hole 11X. The through electrode 13 includes the adhesion layers 20 and 22, the metal layers 21, 23, 24, and 25 and the resin layer 26. The resin layer 26 closes the lower opening of the through hole 11X.

Figure 6B:
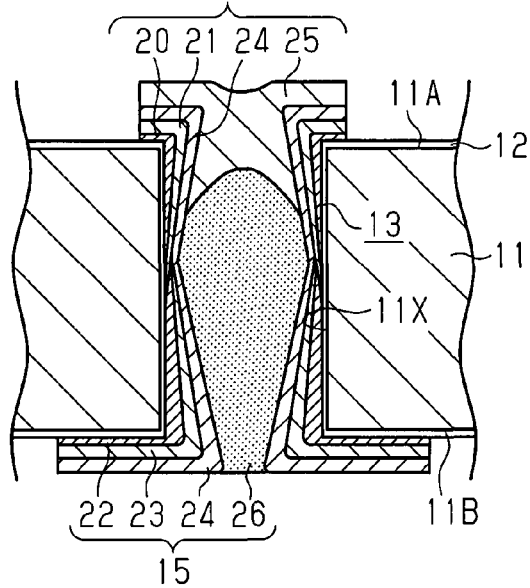

In the step illustrated in FIG. 6B, the adhesion layer 20 and the metal layers 21, 24, and 25, which are stacked on the upper surface 11A of the substrate body 11 with the insulation film 12 located in between, are patterned into a predetermined shape as viewed from above to form the wiring layer 14 on the upper surface 11A of the substrate body 11. The wiring layer 14 includes the upper end of the through electrode 13. Further, the adhesion layer 22 and the metal layers 23 and 24, which are stacked on the lower surface 11B of the substrate body 11 with the insulation film 12 located in between, are patterned into a predetermined shape as viewed from above to form the wiring layer 15 on the lower surface 11B of the substrate body 11. The wiring layer 15 includes the lower end of the through electrode 13. The wiring layers 14 and 15 may be formed through wiring formation processes such as the semi-additive process or the subtractive process.

Figure 6C:
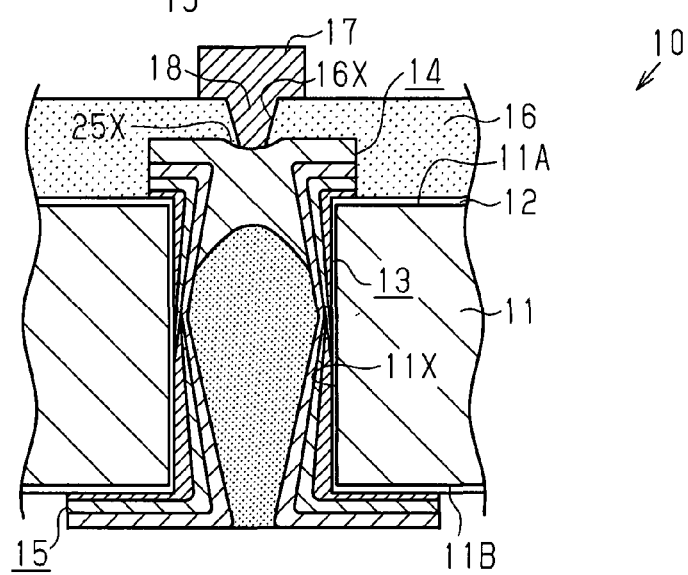

In the step illustrated in FIG. 6C, the insulation layer 16 is formed covering the wiring layer 14 and the upper surface of the insulation film 12. Then, the via hole 16X, which exposes the upper surface of the wiring layer 14, is formed in a predetermined location of the insulation layer 16. In the present example, the via hole 16X partially exposes the upper surface of the wiring layer 14 (recess 25X) formed immediately above the through hole 11X. Then, the via wiring 18 is formed in the via hole 16X, and the wiring layer 17 is formed on the upper surface of the insulation layer 16. As a result, the via wiring 18 is stacked immediately above the through electrode 13 with the wiring layer 14 located in between, and the via wiring 18 electrically connects the wiring layer 17 and the wiring layer 14. The via wiring 18 and the wiring layer 17 may be formed through wiring formation processes such as the semi-additive process or the subtractive process.

The manufacturing steps described above obtain the wiring substrate 10 illustrated in FIG. 1.

The present embodiment has the advantages described below.

(1) Each through hole 11X is partially filled with the resin layer 26. Thus, for example, there is no need for the through hole 11X to be entirely filled with an electrolytic plating film (e.g., metal layer 25). Thus, in comparison with when entirely filling the through hole 11X with a plating film, the time for forming the through electrode 13 may be shortened. Accordingly, the manufacturing cost may be reduced.

(2) The upper opening of each through hole 11X is closed with the conductive layer that includes the metal layer 25. The conductive layer includes the adhesion layer 20 and the metal layers 21, 24, and 25. A portion of the conductive layer is used as the upper end of the through electrode 13. The via wiring 18 is formed immediately above each through electrode 13. That is, the via wiring 18 is arranged on the through electrode 13 with a stacked-via structure. Accordingly, the wiring layers 14 and 17, which are stacked on the upper surface 11A of the substrate body 11, may easily be reduced in size.

(3) The seed layer, which includes the adhesion layers 20 and 22 and the metal layers 21, 23, and 24, are formed on the wall surface of each through hole 11X, and electrolytic plating is performed using the seed layer as the power supplying layer to close the upper opening of the through hole 11X with the metal layer 25. Then, the cavity S1 in the through hole 11X is filled with the resin layer 26. In this structure, the adhesion layers 20 and 22, the metal layers 21, 23, 24, and 25, and the resin layer 26 form each through electrode 13. This allows the region in the through hole 11X where electrolytic plating forms the metal layer 25 to be less than or equal to one half of the depth of the through hole 11X. Accordingly, even when the through hole 11X has a high aspect ratio, seams and voids formed in the metal layer 25 (through electrode 13) may be reduced in a desirable manner.

(4) The upper end of each through electrode 13 is formed by a portion of the adhesion layer 20 and portions of the metal layers 21, 24, and 25, and the upper end of the through electrode 13 is used as the wiring layer 14. Further, the lower end of the through electrode 13 is formed by a portion of the adhesion layer 22 and portions of the metal layers 23 and 24, and the lower end of the through electrode 13 is used as the wiring layer 15. Thus, the material costs of the wiring layers 14 and 15 may be reduced compared to when the wiring layer 14 is not formed integrally with the through electrode 13 and when the through electrode 13 is not formed integrally with the through electrode 13. This, in turn, reduces the manufacturing costs.

(5) In the conventional through electrode that is formed using the bottom-up plating technique, the plating film deposited in the through hole comes into contact with the wall surface of the through hole but is not adhered to the wall surface of the through hole. In this structure, for example, when a wiring substrate including the through electrode is repetitively used under a hot environment or a cold environment, the difference in the coefficients of thermal expansion between the silicon substrate (silicon) and the through electrode (copper) may produce a pumping effect (expansion and contraction resulting from temperature variations). This may result in the separation of copper from the wall surface and cause defective conduction of the through electrode.

In contrast, the present embodiment forms the adhesion layer 20 (titanium) between the insulation film 12 (silicon oxide film) and the metal layer 21 (copper). The adhesion layer 20 has higher adhesion to the insulation film 12 than the metal layer 21. Further, the adhesion layer 22 (titanium) is formed between the insulation film 12 and the metal layer 23 (copper). The adhesion layer 22 has higher adhesion to the insulation film 12 than the metal layer 23. Thus, the insulation film 12 and the metal layer 21 adhere to the adhesion layer 20 in a favorable manner, and the insulation film 12 and the metal layer 23 are adhered to the adhesion layer 22 in a favorable manner. As a result, even when the wiring substrate 10 is repetitively used under a hot environment or a cold environment, the occurrence of the pumping effect in copper is limited. This limits the separation of the metal layers 21 and 23 (copper) from the wall surface of the through hole 11X. Accordingly, conduction failures of the through electrode 13 are limited in a desirable manner.

(6) Since the occurrence of the pumping effect in copper is limited, the production of cracks in the insulation layer 16, which is formed by polyimide and the like, may be limited. When the pumping effect occurs in copper, cracks may be produced in the insulation layer 16 at portions that are in contact with copper (Cu). In contrast, the wiring substrate 10 of the present embodiment limits the occurrence of the pumping effect in copper. This reduces cracks produced in the portion of the insulation layer 16 that contacts copper.

(7) The metal layer 24 is formed covering the adhesion layers 20 and 22 and the metal layers 21 and 23 stacked on the wall surface of each through hole 11X with the insulation film 12 located in between. The metal layer 24 ensures conduction from the upper surface 11A to the lower surface 11B of the substrate body 11 in a desirable manner.

Second Embodiment

A second embodiment will now be described with reference to FIGS. 7 to 9C. The wiring substrate of the second embodiment differs from the first embodiment in the structure of the through electrode 13 and the wiring layers 14 and 15. The description hereafter will focus on the differences from the first embodiment. Like or same reference numerals are given to those components that are the same as the corresponding components illustrated in FIGS. 1 to 6C. Such components will not be described in detail.

Figure 7:
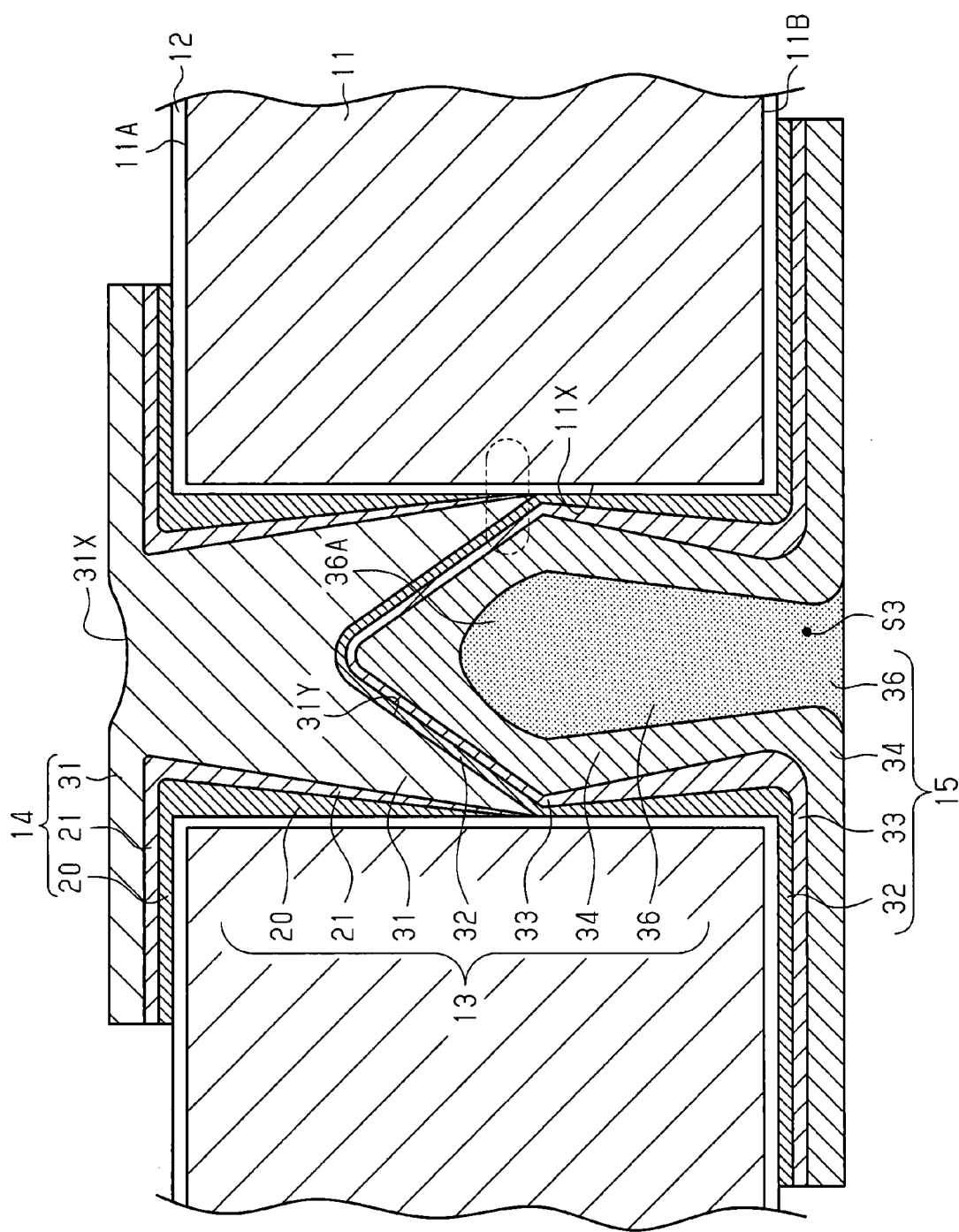
FIG. 7 is an enlarged cross-sectional view illustrating a portion of a wiring substrate in a second embodiment.

As illustrated in FIG. 7, the through electrode 13 includes the adhesion layer 20, the metal layer 21, a metal layer 31, an adhesion layer 32, a metal layer 33, a metal layer 34, and a resin layer 36.

The adhesion layer 20 and the metal layer 21 are sequentially stacked on the insulation film 12 over the upper surface 11A of the substrate body 11 and the upper wall surface of the through hole 11X.

The upper open region of the through hole 11X is filled with the metal layer 31. In the present example, the metal layer 31 fills the upper open region of the through hole 11X that is about one half of the through hole 11X. Accordingly, the metal layer 31 closes the upper opening of the through hole 11X. Further, the adhesion layer 20 and the metal layer 21 closes the upper opening of the through hole 11X together with the metal layer 31. The metal layer 31 includes an end located near the mid-depth portion of the through hole 11X. The end of the metal layer 31 is directly formed on the insulation film 12 without the metal layer 21 located in between. Further, the metal layer 31 is stacked on the upper surface 11A of the substrate body 11 near the upper opening of the through hole 11X with the insulation film 12, the adhesion layer 20, and the metal layer 21 and 24 located in between. In this manner, the metal layer 31 extends out of the upper wall surface of the through hole 11X over the upper surface 11A of the substrate body 11. The upper surface of the metal layer 31 includes a recess 31X that hollows in the downward direction. The recess 31X is located at a position overlapping the through hole 11X in a plan view. The lower surface of the metal layer 31 in the through hole 11X includes a recess 31Y that hollows in the upward direction. The recess 31Y is, for example, curved in the upward direction.

The adhesion layer 32 covers the surface of the insulation film 12 over the lower wall surface of the through hole 11X, that is, about one half of the wall surface of the through hole 11X. The adhesion layer 32 entirely covers the surface of the insulation film 12 extending out of the metal layer 31 over the wall surface of the through hole 11X. Further, the adhesion layer 32 covers the insulation film 12 formed on the lower surface 11B of the substrate body 11 near the lower opening of the through hole 11X. The adhesion layer 32 continuously covers the surface of the insulation film 12 over the lower surface 11B of the substrate body 11 and the lower wall surface of the through hole 11X. In the present example, the adhesion layer 32 is not directly connected to the adhesion layer 20 and the metal layer 21. That is, the adhesion layer 32 is not electrically connected to the adhesion layer 20 and the metal layer 21.

The adhesion layer 32 stacked on the insulation film 12 at the lower wall surface of the through hole 11X has a thickness that gradually decreases toward the mid-depth portion of the through hole 11X. Accordingly, the adhesion layer 32 projects in the horizontal direction toward the center of the through hole 11X near the lower opening of the through hole 11X. The thickness of the adhesion layer 32 may be, for example, approximately, 0.05 to 0.5 μm on the lower surface 11B of the substrate body 11 and near the lower opening of the through hole 11X.

Preferably, the material of the adhesion layer 32 has higher adhesion to the insulation film 12 (e.g., silicon oxide film) than the metal layer 33 (e.g., copper layer). For example, titanium, tantalum, chromium, or titanium tungsten may be used as the material of the adhesion layer 32. Further, for example, a sputter film formed through sputtering may be used as the adhesion layer 32.

The metal layer 33 covers the surface of the adhesion layer 32. The metal layer 33 continuously covers locations corresponding to the lower surface 11B of the substrate body 11 near the lower opening of the through hole 11X, the lower wall surface of the through hole 11X, and the lower surface of the metal layer 31. In other words, the adhesion layer 32 is formed between the substrate body 11 and the metal layer 33.

In this manner, the adhesion layer 20, the metal layer 21, the adhesion layer 22, the metal layer 31, the adhesion layer 32, and the metal layer 33 are stacked in this order on the insulation film 12 in the through hole 11X near the mid-depth portion (refer to broken lines in FIG. 7).

The metal layer 33 stacked on the adhesion layer 32 over the lower wall surface of the through hole 11X has a thickness that gradually decreases toward the mid-depth portion of the through hole 11X. The thickness of the metal layer 23 may be, for example, approximately, 0.05 to 0.5 μm over the lower surface 11B of the substrate body 11 and near the lower opening of the through hole 11X.

For example, copper or a copper alloy may be used as the material of the metal layer 33. A sputter film formed through sputtering may be used as the metal layer 21.

The metal layer 34 covers the surface of the metal layer 33. The metal layer 34 continuously covers the lower surface of the metal layer 33 at locations corresponding to the lower surface 11B of the substrate body 11, the lower wall surface of the through hole 11X, and the lower surface of the metal layer 31.

The metal layer 34 stacked on the metal layer 33 over the lower wall surface of the through hole 11X has a thickness that gradually decreases toward the mid-depth portion of the through hole 11X.

For example, copper or a copper alloy may be used as the material of the metal layer 34. For example, a metal layer formed by performing electrolytic plating (electrolytic plating metal layer) may be used as the metal layer 34.

The adhesion layers 20 and 32 and the metal layers 21, 31, 33, and 34 serve as a conductive layer. The conductive layers define an cavity S3 in the through hole 11X. The cavity S3 in the through hole 11X is filled with the resin layer 36. In the present example, the cavity S3 surrounded by the metal layer 34 is filled with the resin layer 26. The upper end of the resin layer 36 includes a projection 36A that projects in the upward direction. The projection 36A is located in the recess 31Y. The material of the resin layer 36 may be, for example, similar to the material of the resin layer 26.

The adhesion layers 20 and 32, the metal layers 21, 31, 33, and 34, and the resin layer 36 function as the through electrode 13 in the through hole 11X. The adhesion layer 20 and the metal layers 21 and 31 function as the wiring layer 14 over the upper surface 11A of the substrate body 11. The upper end of the through electrode 13 also functions as a portion of the wiring layer 14. In this manner, the wiring layer 14 is formed integrally with the upper end of the through electrode 13. The adhesion layer 32, the metal layers 33 and 34, and the resin layer 36 function as the wiring layer 15 over the lower surface 11B of the through electrode 13. The lower end of the through electrode 13 also functions as a portion of the wiring layer 15. In this manner, the wiring layer 15 is formed integrally with the lower end of the through electrode 13. The lower surface of the resin layer 36 is exposed from the lower surface of the wiring layer 15.

A method for manufacturing the wiring substrate 10 will now be described with reference to FIGS. 8A to 9C. FIGS. 8A to 9C are enlarged views illustrating the through hole 11X and the surrounding of the through hole 11X.

Figure 8A:
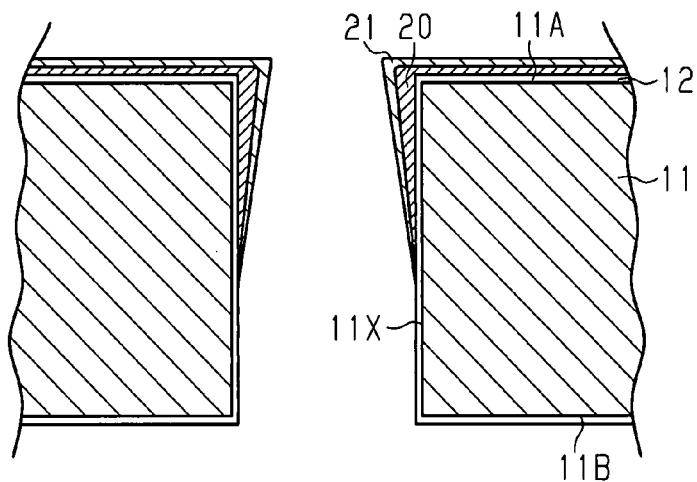
FIGS. 8A to 8C and 9A to 9C are schematic cross-sectional views illustrating how the wiring substrate of FIG. 7 is manufactured.

In the step illustrated in FIG. 8A, like the step illustrated in FIG. 3A, the through hole 11X is formed in the substrate body 11, and the insulation film 12 entirely covers the surfaces of the substrate body 11. Then, like the step illustrated in FIG. 3B, the adhesion layer 20 and the metal layer 21 are sequentially formed on the upper surface 11A of the substrate body 11 and the upper wall surface of the through hole 11X.

Figure 8B:
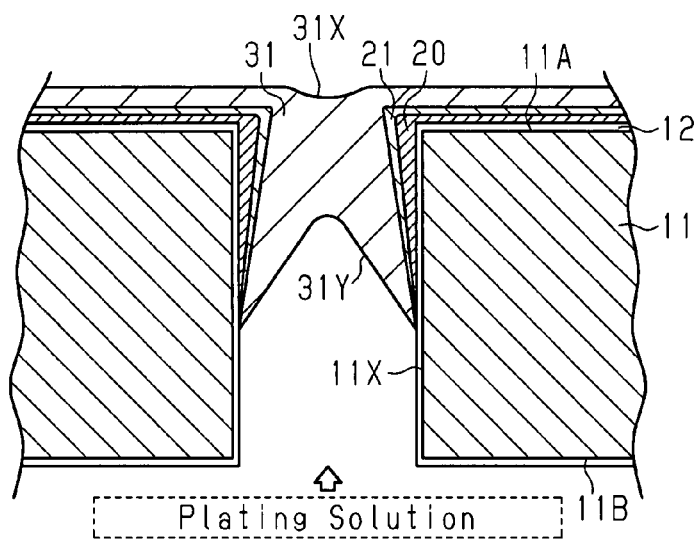

In the step illustrated in FIG. 8B, the metal layer 31 is formed. The metal layer 31 closes the upper opening of the through hole 11X and covers the upper surface of the metal layer 21, which is stacked over the upper surface 11A of the substrate body 11 with the insulation film 12 and the adhesion layer 20 located in between. The metal layer 31 is formed by, for example, supplying a plating solution from the lower surface 11B of the substrate body 11 and performing electrolytic plating using a seed layer, which includes the adhesion layer 20 and the metal layer 21, as a power supplying layer. In this case, a plating film grows in an isotropic manner from the metal layer 21. That is, the metal layer 31 is formed as a conformal plating. This forms the recess 31X in the upper surface of the metal layer 31 and the recess 31Y in the lower surface of the metal layer 31 in the through hole 11X at a location overlapping the through hole 11X in a plan view. In this step, plating solution is supplied from the lower surface 11B of the substrate body 11 to form the metal layer 31 in an isotropic manner from the end of the metal layer 21 in the through hole 11X. Thus, the metal layer 31 covers the portion of the insulation film 12 extending out of the metal layer 21.

The above manufacturing steps close the upper opening of the through hole 11X with the adhesion layer 20 and the metal layers 21 and 31. The metal layer 31 forms a closed end of the through hole 11X, and the through hole 11X is recessed.

Figure 8C:
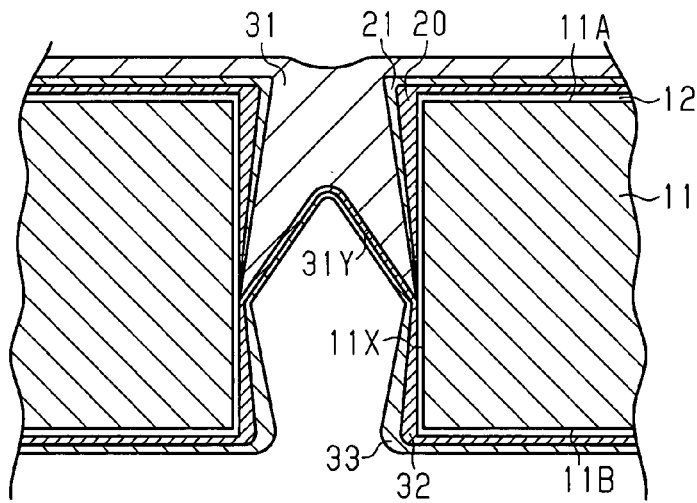

In the step illustrated in FIG. 8C, the adhesion layer 32 and the metal layer 33 are sequentially formed at locations corresponding to the lower surface 11B of the substrate body 11, the lower wall surface of the through hole 11X, and the lower surface of the metal layer 31 (surface in recess 31Y). Sputtering may be performed to form the adhesion layer 32 and the metal layer 33. For example, titanium is sputtered toward the lower surface 11B of the substrate body 11 to deposit the adhesion layer 32 at locations corresponding to the lower surface 11B of the substrate body 11, the lower wall surface of the through hole 11X, and the lower surface of the metal layer 31 and continuously cover these surfaces. Then, copper is sputtered to deposit the metal layer 31 on the adhesion layer 32. In this case, the deposited amount of titanium or copper increases over the lower surface 11B and near the lower opening of the through hole 11X and gradually decrease toward the mid-depth portion of the through hole 11X. Accordingly, the thickness of the adhesion layer 32 and the thickness of the metal layer 33 decrease toward the mid-depth portion of the through hole 11X.

The adhesion layer 32 (e.g., Ti layer) formed between the insulation film 12 and the metal layer 33 has higher adhesion to the insulation film 12 than the metal layer 33. Thus, the adhesion layer 32 adheres the insulation film 12 to the metal layer 33 in a favorable manner.

Figure 9A:
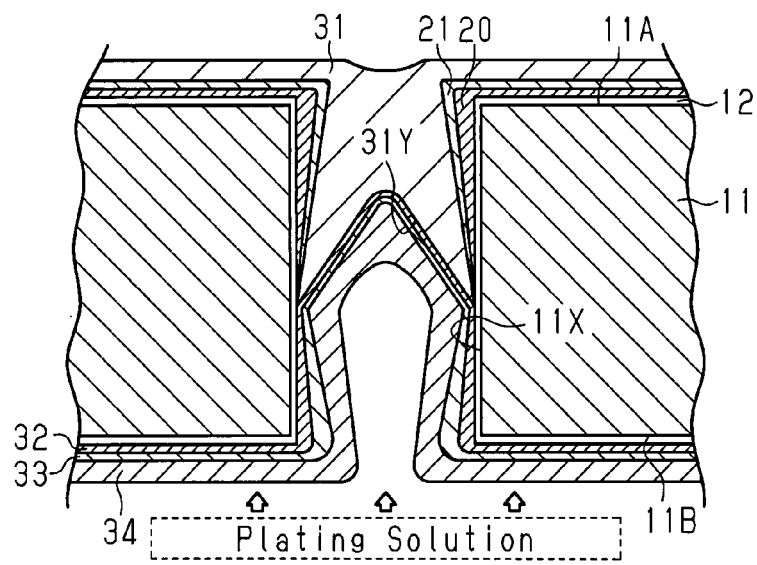

Then, in the step illustrated in FIG. 9A, the metal layer 34 is formed entirely covering the surface of the metal layer 33. For example, the metal layer 23 is formed by entirely supplying the surface of the metal layer 33 with a plating solution and performing electrolytic plating using a seed layer, which includes the adhesion layer 32 and the metal layer 33, as a power supplying layer.

Figure 9B:
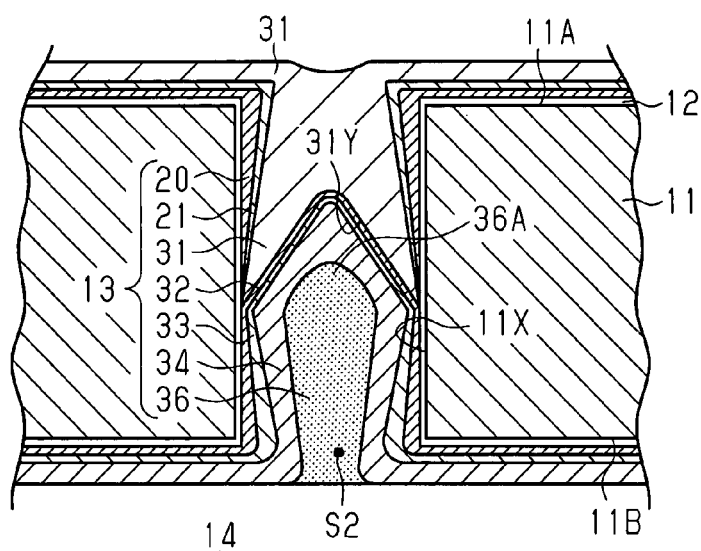

In the step illustrated in FIG. 9B, the resin layer 36 is formed in the same manner as the steps illustrated in FIGS. 5B to 6A. The through hole 11X covered by the metal layer 34, that is, the cavity S2 surrounded by the metal layer 34, is filled with the resin layer 36. The resin layer 36 closes the lower opening of the through hole 11X.

The above manufacturing steps form the through electrode 13 in the through hole 11X. The through electrode 13 includes the adhesion layers 20 and 32, the metal layers 21, 31, 33, and 34, and the resin layer 36.

Figure 9C:
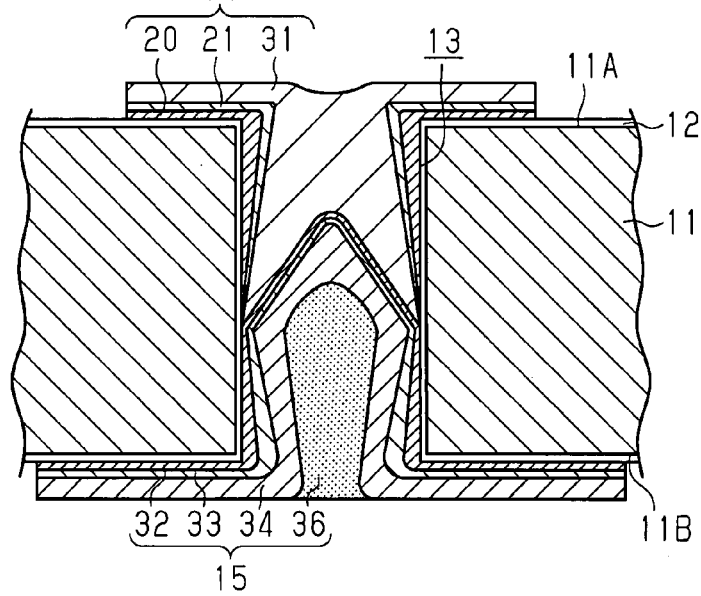

In the step illustrated in FIG. 9C, the adhesion layer 20 and the metal layers 21 and 31, which are stacked over the upper surface 11A of the substrate body 11 with the insulation film 12 located in between, are patterned into a predetermined shape as viewed from above to form the wiring layer 14 on the upper surface 11A of the substrate body 11. The wiring layer 14 includes the upper end of the through electrode 13. Further, the adhesion layer 32 and the metal layers 33 and 34, which are stacked over the lower surface 11B of the substrate body 11 with the insulation film 12 located in between, are patterned into a predetermined shape as viewed from above to form the wiring layer 15 on the lower surface 11B of the substrate body 11. The wiring layer 15 includes the lower end of the through electrode 13. The wiring layers 14 and 15 may be formed through wiring formation processes such as the semi-additive process or the subtractive process.

In the same manner as the step illustrated in FIG. 6C, the insulation layer 16 including the via hole 16X is formed, the via hole 16X is filled with the via wiring 18, and the wiring layer 17 is stacked on the insulation layer 16. The above manufacturing steps manufacture the wiring substrate 10 of the second embodiment.

In addition to advantages (1) to (6) of the first embodiment, the second embodiment has the advantages described below.

(8) The metal layer 31 fills the upper open region of the through hole 11X that is about one half of the through hole 11X, and the adhesion layer 32 and the metal layer 33 entirely cover the lower surface of the metal layer 31. Accordingly, the adhesion layer 32 and the metal layers 31 and 33 ensure conduction from the upper surface 11A to the lower surface 11B of the substrate body 11 in a favorable manner.

It should be apparent to those skilled in the art that the present invention may be embodied in many other specific forms without departing from the spirit or scope of the invention. Particularly, it should be understood that the present invention may be embodied in the following forms.

In each of the above embodiments, the structure of the conductive layer formed on the wall surface of the through hole 11X may be changed.

Figure 10:
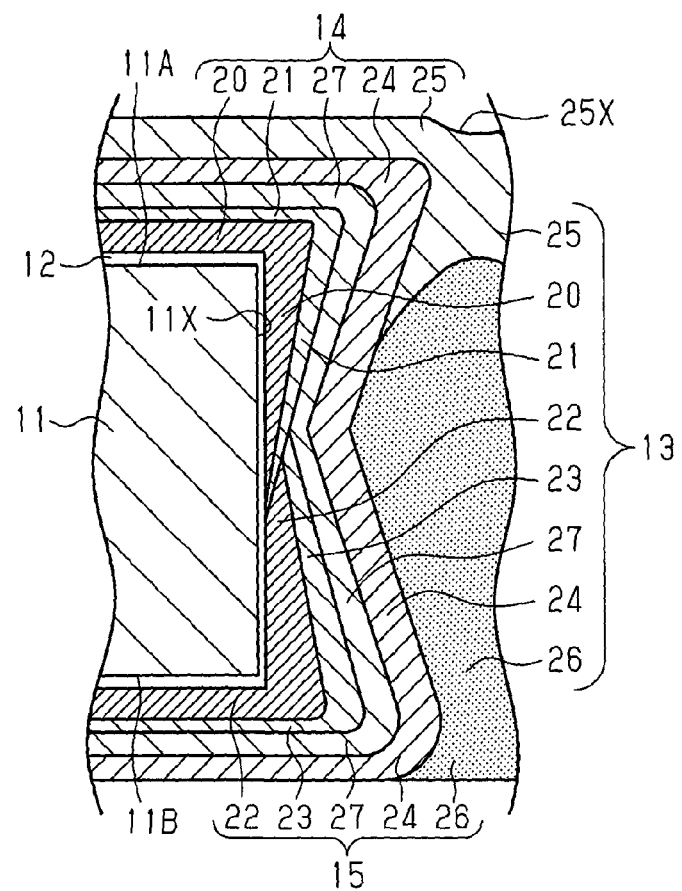
FIG. 10 is an enlarged cross-sectional view illustrating a portion of a wiring substrate in a modified example.

For example, as illustrated in FIG. 10, a metal layer 27 may be formed between the metal layer 21 and the metal layer 24 and between the metal layer 23 and the metal layer 24. The metal layer 27 covers the metal layers 21 and 23. Preferably, the metal layer 27 continuously covers the surface of the metal layer 21 and the surface of the metal layer 23 at locations corresponding to the upper surface of the substrate body 11, the upper wall surface of the through hole 11X, the lower wall surface of the through hole 11X, and the lower surface 11B of the substrate body 11. For example, copper or a copper alloy may be used as the material of the metal layer 27. An electroless plating metal layer formed through electroless plating may be used as the metal layer 27.

In such a structure, favorable conduction is ensured from the upper surface 11A to the lower surface 11B of the substrate body 11. Accordingly, by performing electrolytic plating using the metal layer 27 as the power supplying layer to form the metal layers 24 and 25, the resistance of the power supplying layer decreases compared to when using the adhesion layer 20 (Ti) as the power supplying layer. This allows electrolytic plating to be stably performed.

In such a structure, the wiring layer 14 includes the adhesion layer 20 and the metal layers 21, 27, 24, and 25. Further, the wiring layer 15 includes the adhesion layer 22, the metal layers 23, 27, and 24, and the resin layer 26.

The metal layer 24 may be omitted from the through electrode 13 and from the wiring layers 14 and 15 illustrated in FIG. 10. In this case, for example, the metal layer 25 may be formed by performing electrolytic plating using the metal layer 27 (fourth metal layer) as a power supplying layer.

In the first embodiment, the metal layer 24 may be eliminated. In this case, the metal layer 25 covers at least a portion of the metal layer 21 and closes the upper opening of the through hole 11X. Further, the cavity surrounded by the metal layer 21, the metal layer 23, and the metal layer 25 is filled with the resin layer 26.

In the second embodiment, the metal layer 34 may be omitted. In this case, the cavity surrounded by the metal layer 33 in the through hole 11X is filled with the resin layer 36.

In each of the above embodiments and the modified example illustrated in FIG. 10, the metal layers 21, 23, and 33 may be eliminated. In this case, in the first embodiment, for example, the metal layer 24 or the metal layer 27 is directly formed on the adhesion layers 20 and 22. Further, in the second embodiment, for example, the metal layer 31 is directly formed on the adhesion layer 20, and the metal layer 34 is directly formed on the adhesion layer 32.

In each of the above embodiments and the modified example illustrated in FIG. 10, the adhesion layers 20, 22, and 32 may be eliminated. In this case, in the first embodiment, for example, the metal layers 21 and 23 are directly formed on the insulation film 12. Further, in the second embodiment, for example, the metal layers 21 and 33 are directly formed on the insulation film 12.

Figure 11:
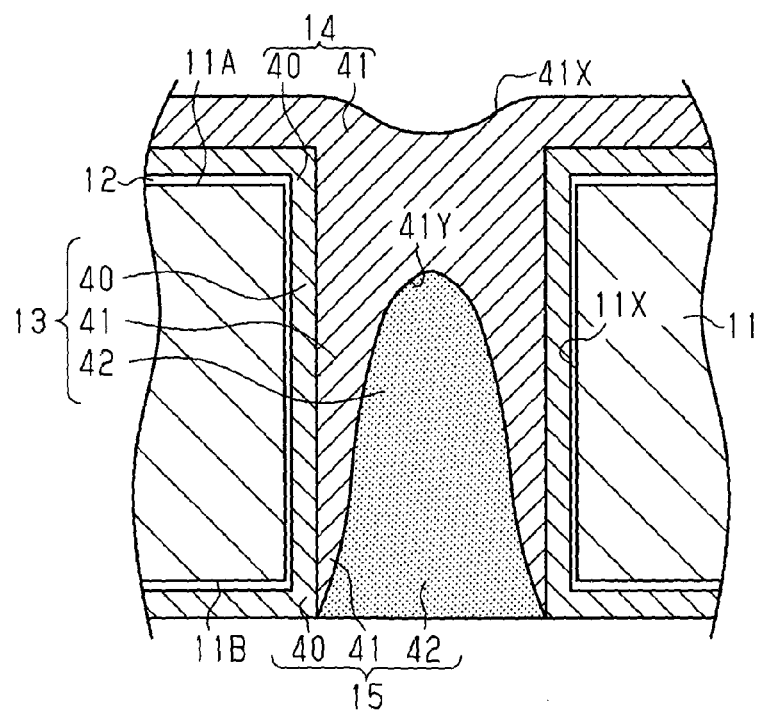
FIG. 11 is an enlarged cross-sectional view illustrating a portion of a wiring substrate in a further modified example.

For example, as illustrated in FIG. 11, instead of the adhesion layers 20 and 22, the metal layers 21 and 23, and the like, a metal layer 40 may be formed entirely covering the wall surface of each through hole 11X and extending out of the through hole 11X over the upper surface 11A and the lower surface 11B of the substrate body 11. The metal layer 40 continuously covers the upper surface 11A of the substrate body 11 near the upper opening of the through hole 11X, the wall surface of the through hole 11X, and the insulation film 12 formed on the lower surface 11B of the substrate body 11 near the lower opening of the through hole 11X. For example, copper or a copper alloy may be used as the material of the metal layer 40. An electroless plating metal layer formed through electroless plating may be used as the metal layer 40.

In the example illustrated in FIG. 11, the metal layer 41 is formed in the through hole 11X. The metal layer 41 covers at least a portion of the metal layer 40 (in FIG. 11, substantially the entire surface of the metal layer 40 formed in the through hole 11X) and closes the upper opening of the through hole 11X. The upper surface of the metal layer 41 includes a recess 41X. The recess 41X is located at a position overlapping the through hole 11X in a plan view. The lower surface of the metal layer 41 includes a recess 41Y that is inwardly curved in the upward direction. For example, the depth of the recess 41Y may be about one half of the depth of the through hole 11X or one half or more of the depth of the through hole 11X. The cavity (in this case, the recess 41Y) surrounded by the metal layers 40 and 41 in the through hole 11X may be filled with the resin layer 42. For example, the same material as the resin layers 26 and 36 may be used as the material of the resin layer 42.

In this structure, the metal layers 40 and 41 and the resin layer 42 function as the through electrode 13 in the through hole 11X. Further, the metal layers 40 and 41 function as the wiring layer 14 on the upper surface 11A of the substrate body 11. Additionally, the upper end of the through electrode 13 functions as a portion of the wiring layer 14. Further, the metal layers 40 and 41 and the resin layer 42 function as the wiring layer 15 on the lower surface 11B of the substrate body 11. In addition, the lower end of the through electrode 13 functions as a portion of the wiring layer 15.

In the second embodiment, the metal layer 31 entirely covers the side surface of the metal layer 21 in the through hole 11X. Instead, for example, the end of the metal layer 21 located near the mid-depth portion of the through hole 11X may extend out of the metal layer 31. In this case, the adhesion layer 32 covers the end of the metal layer 21 near the mid-depth portion of the through hole 11X.

In each of the above embodiments and the above modified examples, glass, glass epoxy resin, or the like may be used in lieu of silicon as the material of the substrate body 11. In this case, the insulation film 12 may be eliminated.

Clauses

This disclosure further encompasses various embodiments described below.

1. A method for manufacturing a wiring substrate, the method including:
    preparing a substrate body;
    forming a through hole extending through the substrate body from an upper surface of the substrate body to a lower surface of the substrate body; and
    forming a through electrode in the through hole;
    wherein the forming a through electrode includes
        forming a first metal layer on an upper wall surface of the through hole,
        forming a second metal layer by performing electrolytic plating using the first metal layer as a power supplying layer so that the second metal layer covers at least a portion of the first metal layer and closes an upper opening of the through hole,
        forming a third metal layer that continuously covers a lower wall surface of the through hole and a lower end of the first metal layer, and
        forming a resin layer that fills a cavity surrounded by the second metal layer and the third metal layer.

2. The method according to clause 1, wherein
    the second metal layer is formed after the third metal layer is formed,
    the forming a through electrode further includes forming a fourth metal layer before forming the second metal layer,
    the fourth metal layer is formed to continuously cover the first metal layer and the third metal layer by performing electrolytic plating using both of the first metal layer and the third metal layer as a power supplying layer,
    the forming a second metal layer includes
        forming a protective film on the lower surface of the substrate body so that the protective film closes a lower opening of the through hole,
        forming the second metal layer by performing electrolytic plating using the first metal layer as a power supplying layer so that the second metal layer covers at least a portion of the fourth metal layer and closes the upper opening of the through hole, and
        removing the protective film; and
    the forming a resin layer includes filling the cavity surrounded by the second metal layer and the fourth metal layer with the resin layer.

3. A method for manufacturing a wiring substrate, the method including:
    preparing a substrate body;
    forming a through hole extending through the substrate body from an upper surface of the substrate body to a lower surface of the substrate body; and
    forming a through electrode in the through hole;
    wherein the forming a through electrode includes
        forming a first metal layer on an upper wall surface of the through hole,
        forming a second metal layer by performing electrolytic plating using the first metal layer as a power supplying layer so that the second metal layer covers the first metal layer and closes an upper opening of the through hole,
        forming a third metal layer that continuously covers a lower wall surface of the through hole and a lower surface of the second metal layer, and
        forming a resin layer that fills a cavity surrounded by the third metal layer.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
   a substrate body;
   a through hole extending through the substrate body from an upper surface of the substrate body to a lower surface of the substrate body, wherein the through hole includes an upper wall surface, which continues with the upper surface, and a lower wall surface, which continues with the lower surface; and
   a through electrode formed in the through hole;
   wherein the through electrode includes
      a conductive layer that forms a cavity in the through hole, and
      a resin layer that fills the cavity formed by the conductive layer,
      wherein the conductive layer includes
         a first metal layer formed on the upper wall surface of the through hole,
         a second metal layer that covers at least a portion of the first metal layer and closes an upper opening of the through hole, and
         a third metal layer formed on the lower wall surface of the through hole and connected to at least one of the first metal layer and the second metal layer.

2. The wiring substrate according to claim 1, wherein the third metal layer covers an end of the first metal layer at a mid-depth portion of the through hole, and
   the cavity surrounded by the second metal layer and the third metal layer is filled with the resin layer.

3. The wiring substrate according to claim 2, wherein the conductive layer further includes a fourth metal layer formed between the first metal layer and the second metal layer and between the third metal layer and the resin layer, and
   the fourth metal layer continuously covers the first metal layer and the third metal layer.

4. The wiring substrate according to claim 1, wherein the second metal layer covers the first metal layer and fills an upper open region of the through hole,
   the third metal layer continuously covers the lower wall surface of the through hole and a lower surface of the second metal layer, and
   the cavity surrounded by the third metal layer is filled with the resin layer.

5. The wiring substrate according to claim 4, wherein the conductive layer further includes a fifth metal layer formed between the third metal layer and the resin layer, and
   the fifth metal layer covers the third metal layer.

6. The wiring substrate according to claim 1, wherein the substrate body is formed from a silicon,
   the wiring substrate further comprises an insulation film that covers the upper and lower wall surfaces of the through hole, and
   the conductive layer further includes
      a first adhesion layer formed between the insulation film and the first metal layer, wherein the first adhesion layer has higher adhesion to the insulation film than the first metal layer, and
      a second adhesion layer formed between the insulation film and the third metal layer, wherein the second adhesion layer has higher adhesion to the insulation film than the third metal layer.

7. The wiring substrate according to claim 1, further comprising:
   a first wiring layer formed on the upper surface of the substrate body and connected to the through electrode; and
   a second wiring layer formed on the lower surface of the substrate body and connected to the through electrode,
   wherein
   the first wiring layer includes the first metal layer and the second metal layer that extend out of the through hole onto the upper surface of the substrate body, and
   the second wiring layer includes the third metal layer that extends out of the through hole onto the lower surface of the substrate body.

* * * * *